United States Patent
Pfefferle et al.

(10) Patent No.: US 7,884,450 B2
(45) Date of Patent: *Feb. 8, 2011

(54) GROWTH OF BORON NANOSTRUCTURES WITH CONTROLLED DIAMETER

(75) Inventors: Lisa Pfefferle, Branford, CT (US); Dragos Ciuparu, New Haven, CT (US)

(73) Assignee: Yale University, New Haven, CT (US)

( * ) Notice: Subject to any disclaimer, the term of this patent is extended or adjusted under 35 U.S.C. 154(b) by 26 days.

This patent is subject to a terminal disclaimer.

(21) Appl. No.: 12/413,275

(22) Filed: Mar. 27, 2009

(65) Prior Publication Data

US 2009/0253580 A1 Oct. 8, 2009

Related U.S. Application Data

(63) Continuation of application No. 11/011,504, filed on Dec. 13, 2004, now Pat. No. 7,531,892.

(60) Provisional application No. 60/528,691, filed on Dec. 11, 2003, provisional application No. 60/559,724, filed on Apr. 6, 2004.

(51) Int. Cl.
*H01L 39/08* (2006.01)
*H01L 39/10* (2006.01)

(52) U.S. Cl. .............. 257/661; 257/E39.005; 257/E39.006; 505/100; 505/704; 977/762; 977/812; 977/822; 977/932

(58) Field of Classification Search .............. 257/661, 257/662, 663, E39.001, E39.005, E39.006; 505/100, 704; 977/762, 812, 822, 932

See application file for complete search history.

(56) References Cited

U.S. PATENT DOCUMENTS

| 6,896,864 | B2 | 5/2005 | Clarke |
| 7,531,892 | B2 * | 5/2009 | Pfefferle et al. .............. 257/661 |

FOREIGN PATENT DOCUMENTS

| JP | 2002-255519 | | 9/2002 |
| JP | 2009173475 A | * | 8/2009 |
| WO | WO-97/32571 | | 9/1997 |
| WO | WO-00/73205 A1 | | 12/2000 |
| WO | WO-01/16155 A1 | | 3/2001 |

OTHER PUBLICATIONS

Derwent abstract for JP 2009173475 A.*

(Continued)

*Primary Examiner*—Anh Phung
*Assistant Examiner*—Michael Lulis
(74) *Attorney, Agent, or Firm*—Riverside Law, LLP

(57) ABSTRACT

A process for growth of boron-based nanostructures, such as nanotubes and nanowires, with a controlled diameter and with controlled chemical (such as composition, doping) as well as physical (such as electrical and superconducting) properties is described. The boron nanostructures are grown on a metal-substituted MCM-41 template with pores having a uniform pore diameter of less than approximately 4 nm, and can be doped with a Group Ia or Group IIa electron donor element during or after growth of the nanostructure. Preliminary data based on magnetic susceptibility measurements suggest that Mg-doped boron nanotubes have a superconducting transition temperature on the order of 100 K.

10 Claims, 6 Drawing Sheets

OTHER PUBLICATIONS

Lim, S. et al., "Synthesis and Characterization of Highly Ordered Co-MCM-41 for Production of Aligned Single Walled Carbon Nanotubes (SWNT)", J. Phys. Chem. B, 107:11048-11056 (2003).

Lim, S. et al., "Preparation of Highly Ordered Vanadium-Substituted MCM-41: Stability and Acidic Properties", J. Phys. Chem. B., 106:8437-8448, (2002).

Oye, G. et al., "A multivariate analysis of the synthesis conditions of mesoporous materials", Microporous and Mesoporous Materials, 34:291-299, (2000).

Yang, Y, et al., "Multivariate correlation and prediction of the synthesis of vanadium substituted mesoporous molecular sieves", Microporous and Mesoporous Materials, 67:245-257, (2004).

Duxiao, J. et al, "Catalytic growth of carbon nanotubes from the internal surface of Fe-loading mesoporous molecular sieves materials", Materials Chemistry and Physics 69: 246-251, (2001).

He, N. et al., "Growth of carbon nanotubules on Fe-loading zeolites and investigation of catalytic active center", Materials Science & Engineering C, 8-9: 151-157 (1999).

Li, J. et al., "The Synthesis of Single-Walled Carbon Nanotubes by CVD Catalyzed with Mesoporous MCM-41 Powder", Science and Application of Nanotubes, Kluwer Academic/Plenum Publishers, 181-193 (2000).

Zheng, G. et al., "Chemical Vapor Deposition Growth of Well-Aligned Carbon Nanotube Patterns on Cubic Mesoporous Silica Films by Soft Lithography", Chem. Mater., 13:2240-2242 (2001).

Ma, Renzhi et al., "Direct Pyrolysis Method for Superconducting Crystalline $MgB_2$ Nanowires", Chem. Mater. 15:3194-3197 (2003).

Yang, Q. et al., "Aligned single crystal boron nanowires", Chem. Physics Letters, 379 (1-2): 87-90 (2003).

Wu, Y. et al., "Superconducting $MgB_2$ Nanowires", Adv. Mater., 13(19): 1487-1489 (2001).

Li, W. Z. et al., "Large-Scale Synthesis of Aligned Carbon Nanotubes", Science 274: 1701-1703 (1996).

Qing-Rong, Feng et al., "Preparation $MgB_2$ Superconducting Fiber at 750°C and 850°C", Chinese J. of Low Temp., 24(2): 96-101 (2002).

Goldberg, Dmitri, "Manufacturing Method of Magnesium Boride Nanowire", Nat. Inst. Mat. Science, (12): (2003).

Yang, Qing at al., "Aligned single crystal $MgB_2$ nanowires", Supercond. Sci. Technol. 17 (8): L31-L33 (2004).

Jones, H.N. et al., "Synthesis of $MgB_2$ by exposure of polycrystalline boron to magnesium vapor", Applied Superconductivity, Abstract, 13(2): 3056-3059 (Jun. 2003).

Ciuparu, D. et al., "Synthesis of Pure Boron Single-Wall Nanotubes", J. Phys. Chem. B, 108(13): 3967-3969 (2004).

Soga, Kohei et al., "Li- and Mg-doping into icosahedral boron crystals, α—and β-rhombohedral boron, targeting high-temperature superconductivity: structure and electronic states", J. Solid State Chem, 177: 498-506 (2004).

Canfield, P.C. et al., "Superconductivity in Dense $MgB_2$ Wires", The Am Phys Soc., 86(11): 2423-2426 (Mar. 2001).

Pokropivny, Vladimir, "Nanostructured superconductors: from granular through wire towards high-$T_c$ nanotubular 2D composites", Int. J. of Nanotechnology, 1(1/2): 170-192 (2004).

Beck, J.S. et al., "A New Family of Mesoporous Molecular Sieves Prepared with Liquid Crystal Templates", J. Am. Chem. Soc. 114: 10834-10843 (1992).

Boustani, I. et al., "Nanotubles of bare boron clusters: Ab initio and density functional study", Europhys. Lett., 39(5): 527-532 (1997).

Boustani, Ihsan et al., "New boron based nanostructured materials", J. Chem. Phys., 110(6): 3176-3185 (1999).

Cao, Limin et al., "Synthesis of well-aligned boron nanowires and their structural stability under high pressure", J. Phys.: Condens. Matter, (14) 11017-11021 (2002).

Cao, Limin et al., "Featherlike Boron Nanowires Arranged in Large-Scale Arrays with Multiple Nanojunctions", Adv. Mater., 14(18) 1294-1297 (2002).

Cao, Limin et al., "Template-catalyst-free growth of highly ordered boron nanowire arrays", Applied Physics Letters 80(22): 4226-4228 (2002).

Cao, Limin et al., "Well-Aligned Boron Nanowire Arrays", Adv. Mater., 13(22): 1701-1704 (2001).

Gindulyte, Asta et al., "Proposed Boron Nanotubes", Inorg. Chem. 37: 6544-6545 (1998).

Meng, X.M. at al., "Boron nanowires synthesized by laser ablation at high temperature", Chem. Phys. Letters 370: 825-828 (2003).

Otten, Carolyn Jones et al., "Crystalline Boron Nanowires", J. Am. Chem. Soc. 124: 4564-4565 (2002).

Park, C.S. et al., "The Deposition Characteristics and the Structural Nature of the Deposit in the Chemical Vapour Deposition of Boron", Thin Solid Films, 131: 205-214 (1985).

Wang, Y.Q. at al., "One-dimensional growth mechanism of amorphous boron nanowires", Chem. Phys. Letts., 359: 273-277 (2002).

Wang, Y.Q. et al., "Application of energy-filtering transmission electron microscopy to characterize amorphous boron nanowires", J. Crystal Growth 244: 123-128 (2002).

Wang, Y.Q. et al., "Amorphous feather-like boron nanowires", Chem. Phys. Letts., 367: 495-499 (2003).

Zhang, Y. et al., "Synthesis of crystalline boron nanowires by laser ablation", Chem. Commun., 2806-2807 (2002).

Ivanovskaya, V.V. et al., "Quantum-Chemical Modelling of the Electronic Structure and the Chemical Bond in Multiwalled Nanotubes Based on Metal Diborides", Theoretical and Experimental Chemistry, vol. 39, No. 1, pp. 1-7 (2003).

Bamburov, V.G. et al., "Electronic Structure and Chemical Bonding in Crystalline and Nanosized Forms of Magnesium Diboride", Doklady Physical Chemistry, vol. 388, Nos. 4-6, pp. 42-47 (2003).

* cited by examiner

GROWTH OF BORON NANOSTRUCTURES WITH CONTROLLED DIAMETER

CROSS-REFERENCE TO OTHER PATENT APPLICATIONS

This application is a continuation of U.S. patent application Ser. No. 11/011,504, filed Dec. 13, 2004, issued as U.S. Pat. No. 7,531,892 on May 12, 2009, which in turn claims the benefit of U.S. provisional Patent Application No. 60/528, 691, filed Dec. 11, 2003, and U.S. provisional Patent Application No. 60/559,724, filed Apr. 6, 2004, the contents of which are incorporated herein by reference in their entirety.

STATEMENT REGARDING FEDERALLY SPONSORED RESEARCH AND DEVELOPMENT

This invention was made with government support under Contract Number CHE-0335218, awarded by NSF—Small grant for innovative research. The Government has certain rights in the invention.

BACKGROUND OF THE INVENTION

Nanostructures, such as nanotubes and nanowires, exhibit technologically important electronic properties and have shown promising applications, including nanoscale electronic and optical devices, high strength materials, electron field emission devices, tips for scanning probe microscopy, and chemical sensors. Boron nanostructures have recently attracted much attention because they are predicted to possess special properties superior to those of other one-dimensional nano-materials. For example, boron nanotubes appear to be stable and, independent of structural helicity, have metallic conductivities exceeding those of carbon nanotubes. Metallic nanotubes can carry large current densities and, by themselves, may be useful for providing electrical interconnects and switches.

Boron compounds have also received renewed interest as a result of the discovery of superconductivity in $MgB_2$. Measurements of the upper critical field, $H_{c2}(T)$, the thermodynamic critical field, $H_c(T)$, and the critical current, $J_c$, indicate that $MgB_2$ is a type-II superconductor with a superconducting transition temperature of $T_c \cong 40$ K and properties that are consistent with an intermetallic superconductor. Measurements of the boron isotope effect in this compound are consistent with the superconductivity being mediated via electron-phonon coupling.

Recent band structure calculations point to the importance of two-phonon pairing for resonant exchange between Cooper pairs in boron compounds such as $MgB_2$. The band structure is also known to depend on the dimensionality of the electron and phonon system. For example, the electron pairing potential can be enhanced in $MgB_2$-nanotubes by several gaps in the phonon density of states, thereby synergetically enhancing both $T_c$ and $J_c$. Such high-temperature superconductors are expected to be important, for example, for efficient lossless transmission of electric power.

It would therefore be desirable to provide a process for the growth of boron-based one-dimensional and two-dimensional nanostructures, such as nanowires and nanotubes, in particular singe-wall nanotubes, with controlled chemical and physical properties and dimensionality in or on a suitable framework material, as well as devices using such nanowires and nanotubes with properties that are superior to those found in three-dimensional structures made from the same or a similar material.

SUMMARY OF THE INVENTION

The invention relates to the growth of boron nanostructures, such as nanotubes and nanowires, with a controlled diameter, a narrow diameter distribution, and controlled chemical and physical properties on mesoporous siliceous frameworks, such as MCM-41. Devices made with the process of the invention can exhibit unique electronic properties due to their low dimensionality, such as high-temperature superconductivity.

According to one aspect of the invention, one-dimensional superconducting device includes a boron nanostructure that has a diameter of less than 100 nm and is impregnated with an electron donor element, wherein the boron nanostructure exhibits a superconducting transition temperature greater than 36 degrees K.

According to another aspect of the invention, an arrangement of superconducting single-wall boron nanotubes includes a framework made of mesoporous silica having pores with a pore size that has a predetermined dimensional relationship with a diameter or cross-sectional area of the boron nanotubes. An element capable of forming a boron complex is dispersed in the pores, and single-wall boron nanotubes are disposed in the pores of the framework and doped with an electron donor element. The boron nanotubes exhibit a superconducting transition temperature greater than 36 degrees K.

According to yet another aspect of the invention, a method for producing a boron nanostructure includes the steps of specifying a diameter or cross-sectional area of the boron nanostructure, selecting a framework having pores with a pore size that has a predetermined dimensional relationship with the diameter or cross-sectional area of the boron nanostructure, wherein the framework includes an element capable of forming a complex with boron, and contacting, in a reactor, the framework with a boron precursor at a temperature sufficient to produce the boron nanostructures with the specified diameter or cross-sectional area.

Embodiments of the invention may include one or more of the following features. The electron donor element can be an element of Group Ia or Group IIa of the periodic table of elements, such as Lithium, Beryllium and/or Magnesium, for example, in form of a metal vapor. The boron nanostructure can be a nanowire having a diameter of, for example, less than 50 nm or a nanotube, for example a single-wall nanotube, with a diameter of, for example, less than 10 nm. The nanostructure can also be a nanofiber with a diameter of, for example, less than 1 nm. The boron atoms of the nanofibers can be arranged in a polyethylene-like chain structure, with the nanofibers aligned in a parallel fashion or intertwined.

The as-grown boron nanostructure can also be exposed to an ambient containing magnesium to form magnesium diboride ($MgB_2$), which is a superconductor with a reported superconducting transition temperature of around 35 K in crystalline form.

The element dispersed in pores can be Mg, B, Ni, Pd, Ce, Co, Mn, Mo and/or Al, or mixtures thereof, which tend to form complexes with boron. Before growth of the nanostructures, the mesoporous silica can be exposed to a precursor of the electron donor element, optionally with the addition of hydrogen.

To increase the selectivity for nanotubes, the as-grown nanostructure, which can also include nanowires, fibers and needles, can be oxidized and subsequently exposed to an alkaline solution, for example a mixture of NaOH and ethanol/water, thereby retaining predominantly boron nanotubes.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF CERTAIN ILLUSTRATED EMBODIMENTS

Figure 1:
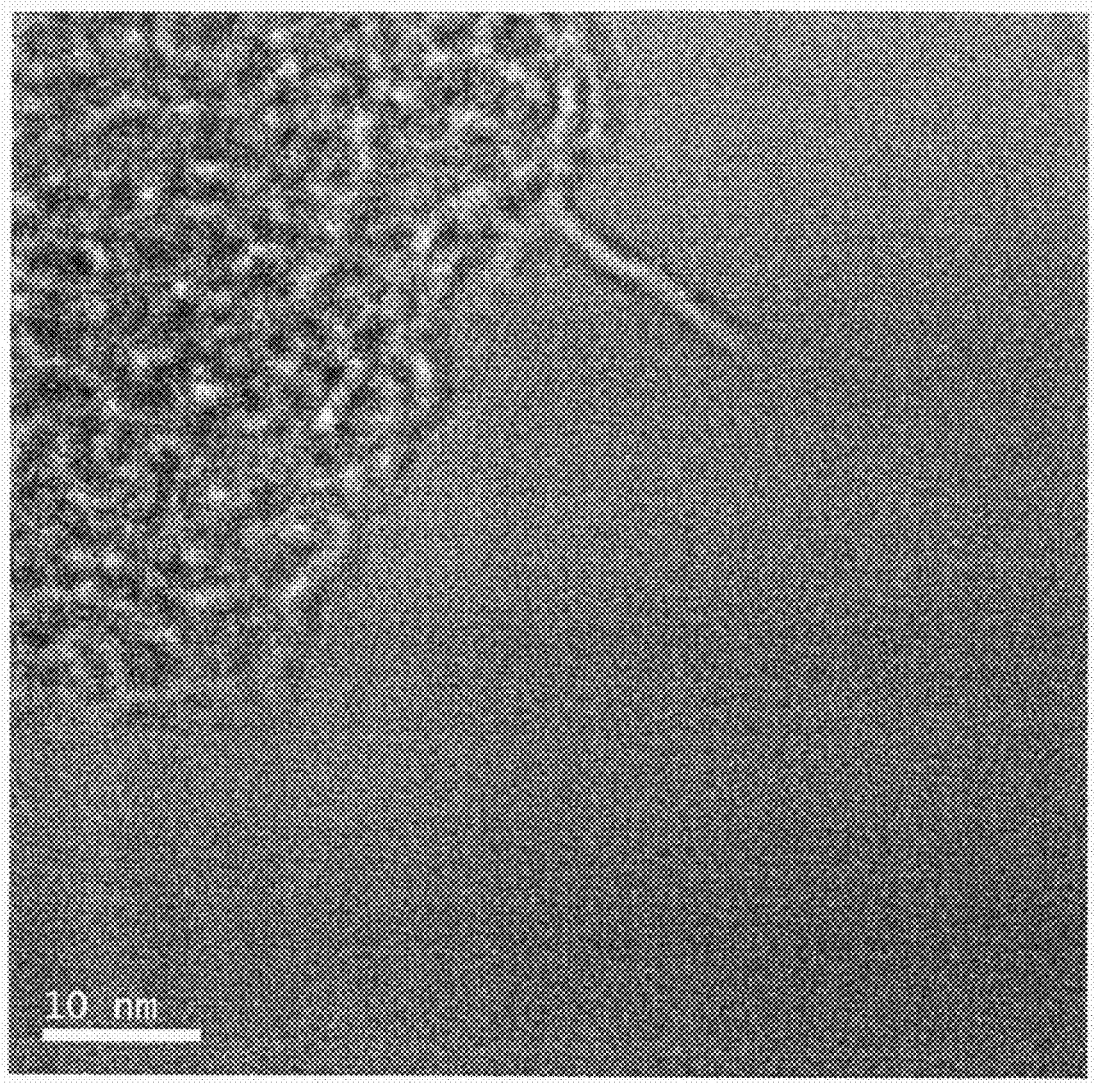
FIG. 1 shows a high-resolution TEM image of an exemplary boron single wall nanotube grown on Mg-MCM-41.

The process described herein is directed, inter alia, to the growth of boron-based nanotubes and nanowires with a controlled diameter and with controlled chemical (such as composition, doping) as well as physical (such as electrical and superconducting) properties.

The process for the growth of boron nanotubes of controlled and uniform diameter uses a templated technique for nanotube synthesis similar to the process that was successfully applied to the grow of aligned single walled carbon nanotubes with a uniform diameter, as described, for example, in commonly assigned U.S. patent application Ser. No. 10/328857, filed 18 Dec. 2002, and U.S. patent application Ser. No. 10/726394, filed 2 Dec. 2003, the contents of which are incorporated herein by reference in their entirety. The template employs a mesoporous silica framework, for example MCM-41, with a parallel system of cylindrical pores having a very narrow distribution of diameters (±0.1 nm full width at half maximum—FWHM) centered at a preselected pore diameter ranging from 1.5-3.5 nm. The pore size of the framework can be controlled by a surfactant and a swelling agent used in the preparation of the framework. The growth of carbon nanotubes disclosed in the above-referenced patent applications is initiated by incorporating an atomically dispersed catalyst or catalyst precursor into substitutional sites in or on the pore walls of the MCM-41 material. The template pore diameter can be modified independently of the chemical composition of the pore wall.

Boron nanotubes were grown by using a magnesium-substituted MCM-41 template with a uniform pore diameter of 3.6 (±0.1) nm. A 6 mm internal diameter quartz reactor was loaded with 200 mg of freshly prepared Mg-MCM-41 template supported in the reactor on an alumina plug. The reactor was placed into an electric furnace and heated under continuous flow of hydrogen to 870° C. When a steady state temperature was reached, $BCl_3$ from Air Products and Chemicals, Inc. (99.9 wt. % purity; 10 ppmw of phosgene impurity) was added to the reactor feed and allowed to flow over the template at a $BCl_3:H_2$ volumetric ratio of approximately 1:6 for 45 minutes. The total flow rate during reaction was 1.5 l/min (standard temperature and pressure). The reactor was then cooled to room temperature under flowing helium. The material recovered from the reactor showed a grayish color and a significantly higher hardness compared to the fresh Mg-MCM-41 sample, suggesting metallic boron is embedded in the template material. It should be mentioned here that the described reaction conditions are significantly milder than those used in other studies of $BCl_3$ reaction with hydrogen to form boron films. Experimental results suggest that magnesium in the Mg-MCM-41 is the catalyst or the catalyst precursor for the growth of single walled boron nanotubes, since a pure siliceous MCM-41 catalyst did not produce boron nanotubes under identical operating conditions. The reaction setup was mounted in the fume hood and the unreacted $BCl_3$ was burnt in a hydrogen flare to prevent releasing the highly toxic $BCl_3$ into the atmosphere.

The boron loaded template was ground in an agate mortar, suspended in ethanol and sonicated for approximately 30 minutes. 0.05 ml of this suspension was dropped on a copper mesh coated with an amorphous holey carbon film and the ethanol evaporated prior to transmission electron microscopy (TEM) analysis.

Figure 2:
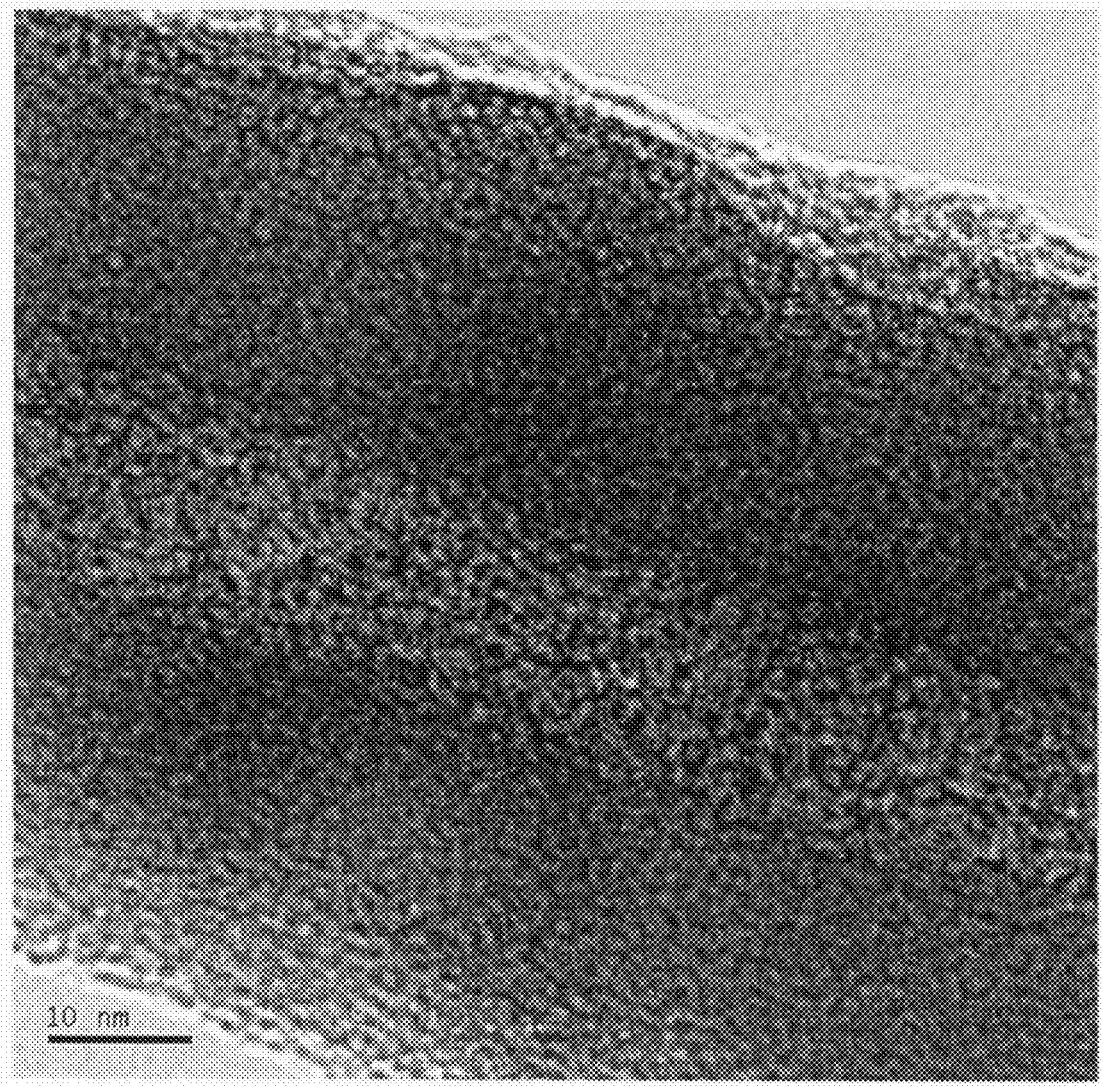
FIG. 2 shows a high-resolution TEM image of a boron nanopipe grown at a higher temperature than the nanotube in FIG. 1.
Figure 3:
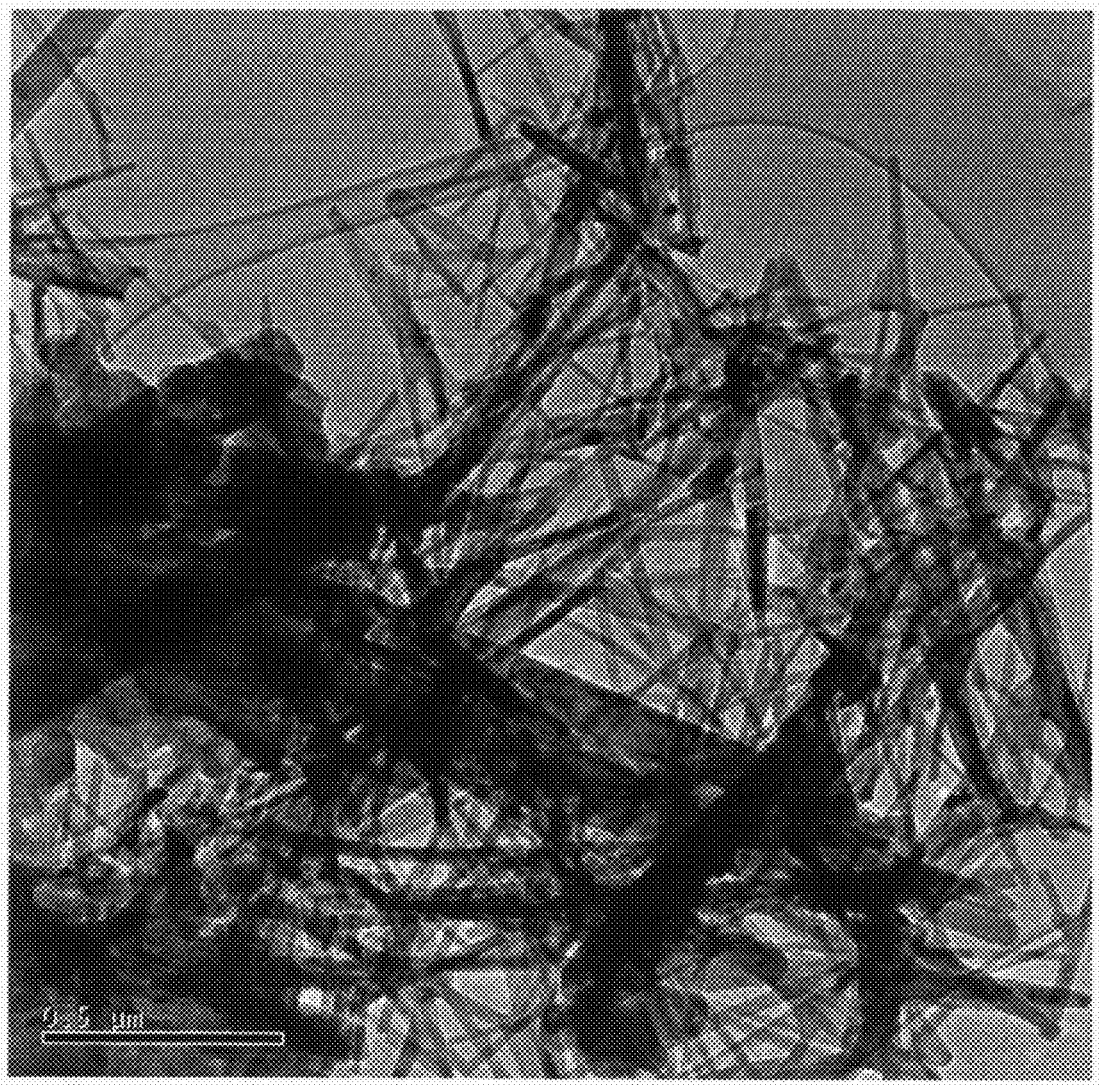
FIG. 3 shows a high-resolution TEM image of bundles of nanowires.
Figure 4:
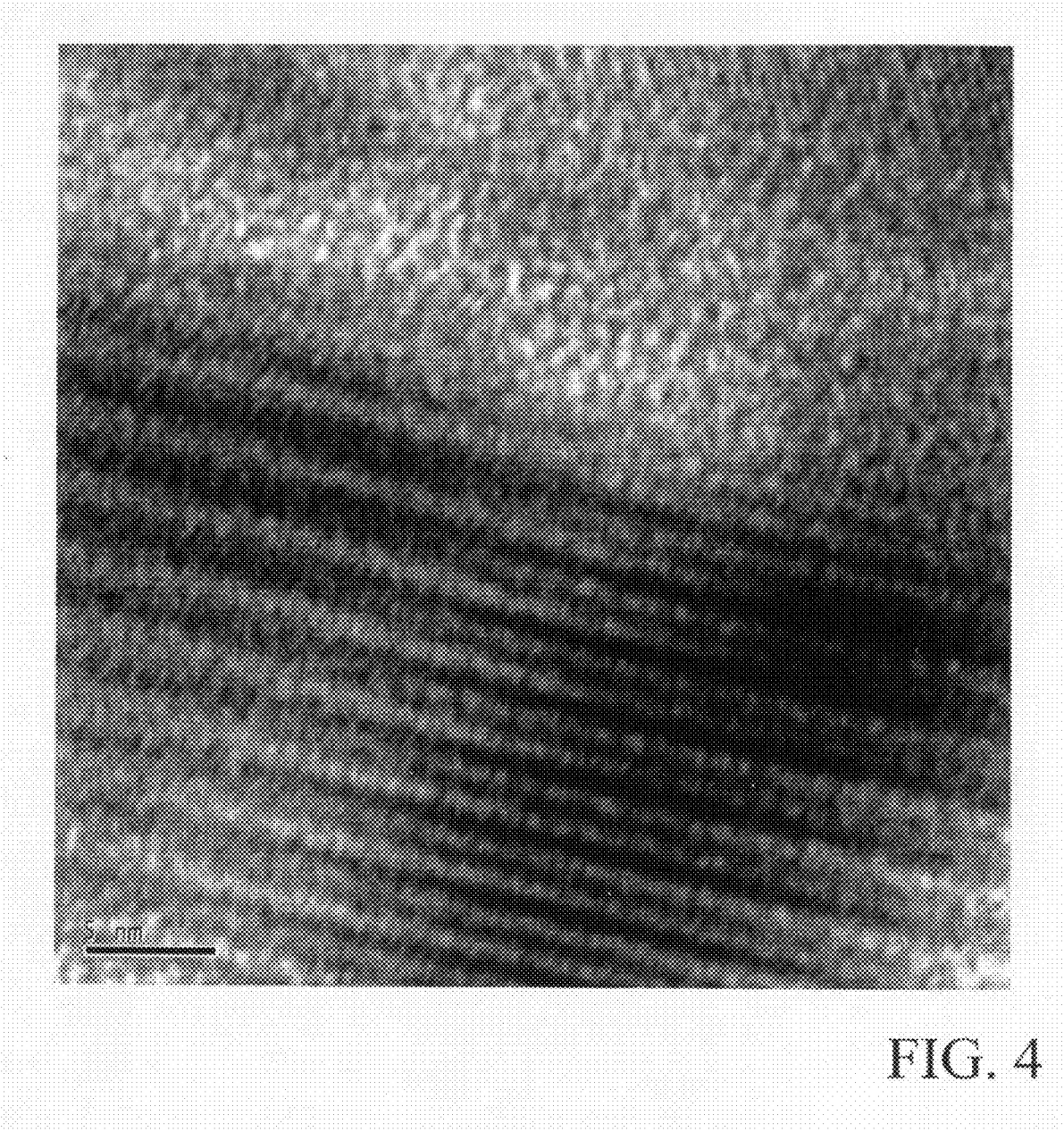
FIG. 4 shows a high-resolution TEM image of groups of nanotubes with uniform diameters.

FIG. 1 shows a high-resolution TEM image of an exemplary boron single wall nanotube grown with the process described above. FIG. 2 shows a high-resolution TEM image of a boron nanopipe grown at a higher temperature and having a wall thickness of approximately 20 nm (nanopipes with wall thicknesses between 3 nm and 40 nm have been observed). FIG. 3 shows a high-resolution TEM image of bundles of nanowires with greater outside diameters than nanopipes. FIG. 4 shows groups of nanotubes that demonstrate the achieved diameter uniformity.

The boron nanotubes can be removed from the Mg-MCM-41 silica template by boiling in water that is either slightly acidic or basic. Tests have shown that a solution of NaOH in ethanol/water can be used to remove the silica without damaging the boron nanotubes. The Mg is almost atomically dispersed in the template and can be washed out with a mild HCl treatment.

Unwanted boron structures other than nanotubes can be removed from the cleaned boron nanomaterials by chemical methods. For example, boron nanopipes and wires have been found to oxidize over time in air, whereas boron nanotubes are stable in air over many months. Treatment of the samples in an oxidizing environment can therefore be used to convert the nanowires/pipes to boron oxide which can then been dissolved in the same type of boiling alkaline solution used to remove the silica template.

Care has to be taken to eliminate from the reactants or from the subsequent chemical treatment traces of materials that can interact with the growth of the boron nanostructures or their physical properties, because boron forms stable compounds with many other compounds due to its short covalent radius and π-type valence orbitals. For this reason, in particular any source of oxygen, nitrogen, and carbon should be eliminated.

Figure 5:
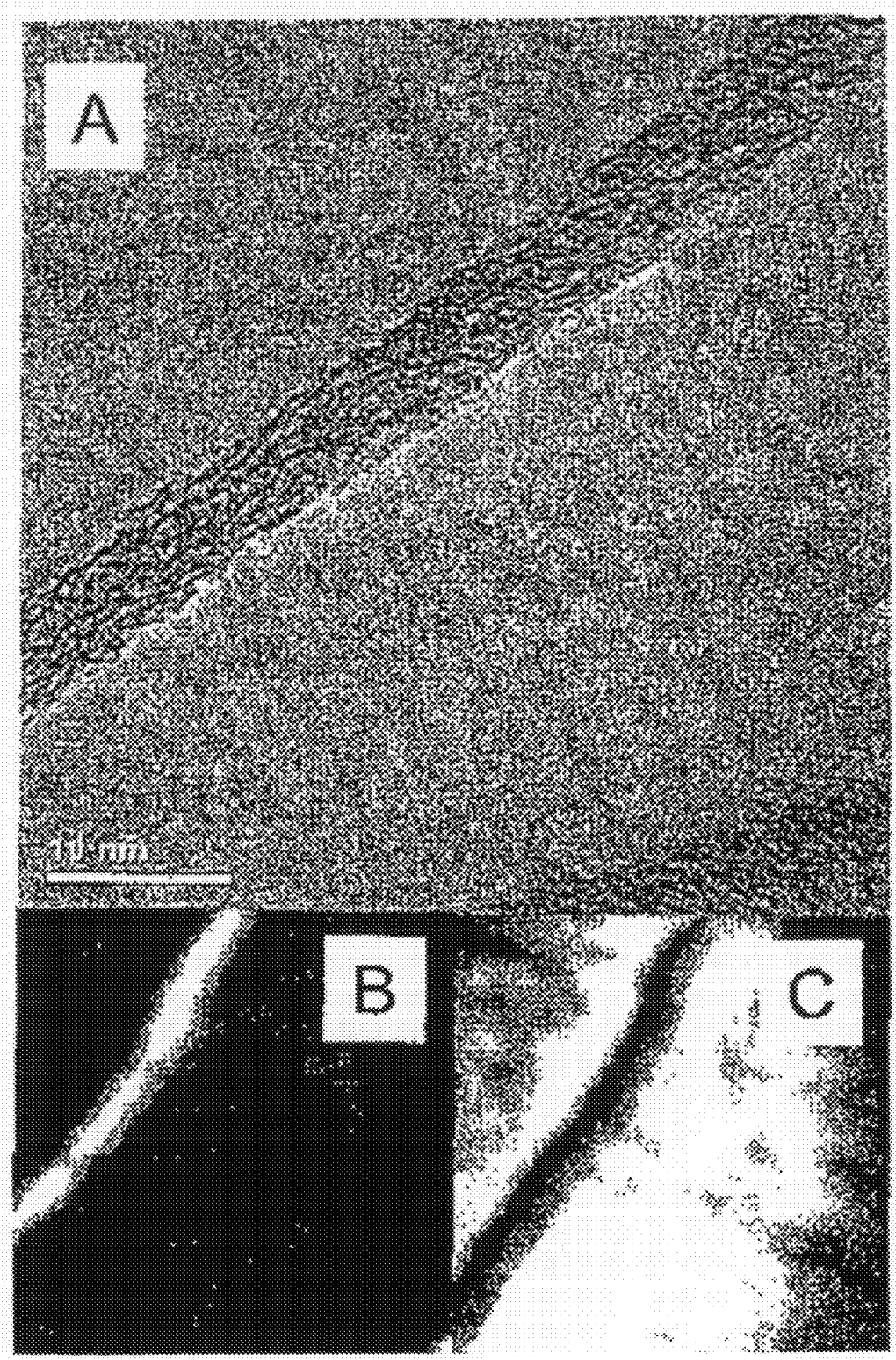
FIG. 5A shows a high-resolution electron micrograph of a boron nanostructure on a carbon-coated grid.
FIG. 5B shows boron-K-edge mapping of the boron nanostructure of FIG. 5A.
FIG. 5C shows carbon-K-edge mapping of the boron nanostructure of FIG. 5A.

FIG. 5A shows a high-resolution TEM image of a boron nanowire placed on a carbon-coated support to determine its chemical composition. FIG. 5B shows an x-ray absorption image at the boron K-edge, clearly demonstrating that the nanostructure is indeed made of boron. FIG. 5C is a corresponding image, with the absorption detected at the K-edge of carbon. The experimental results were checked against a boron nitride standard.

Figure 6:
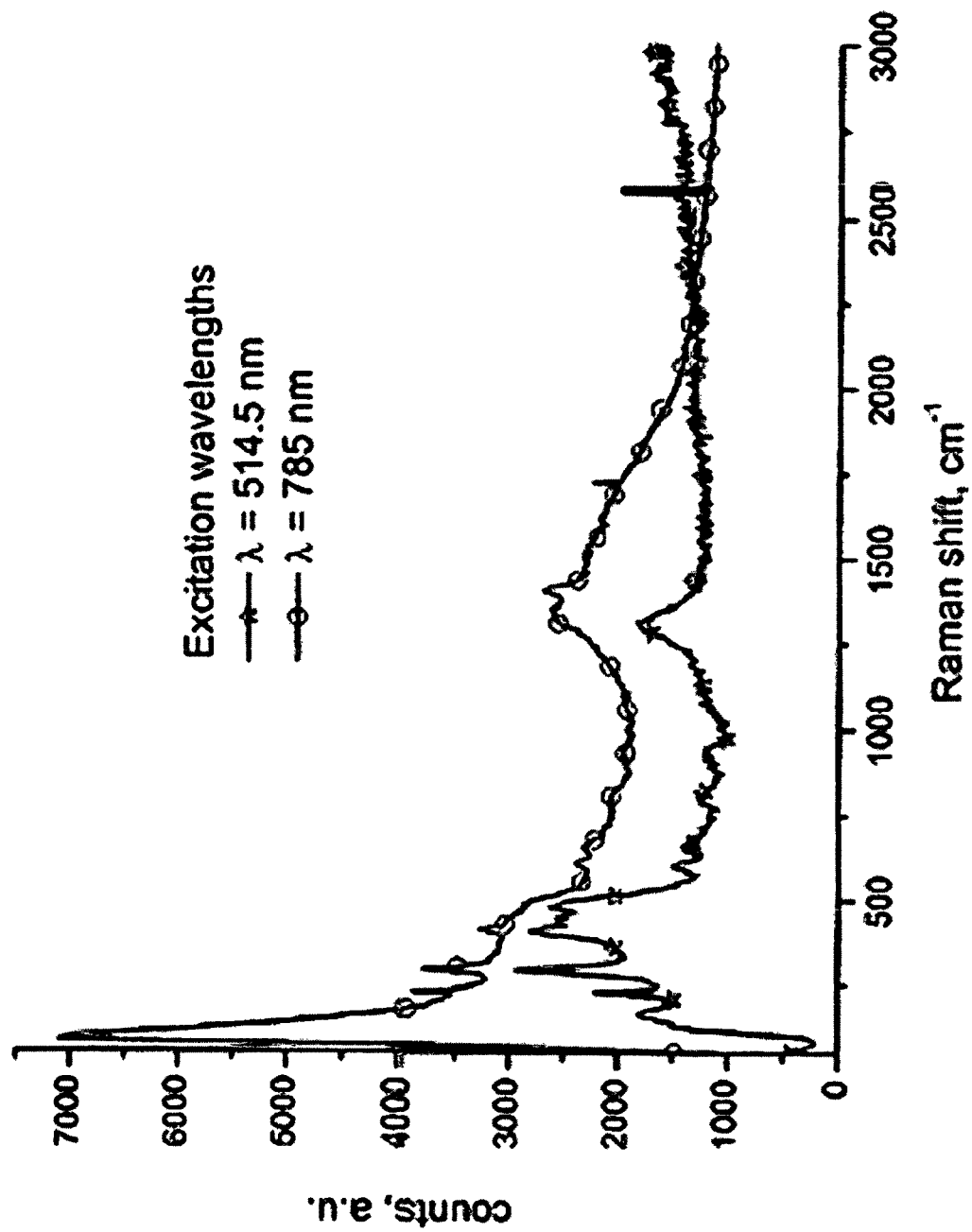
FIG. 6 shows Raman spectra of a boron nanostructure at two excitation wavelengths indicative of a nanotube configuration.

The presence of tubular structures has been also confirmed by the presence of spectral features in the Raman breathing mode region at wave numbers below 500 cm$^{-1}$. The spectrum shown in FIG. 6 was recorded, with a catalyst sample removed from the reactor, without any purification or pretreatment on a Raman spectrometer equipped with an Olympus confocal microscope using a 532 nm excitation wavelength. The peak at 210 cm$^{-1}$ (labeled a in FIG. 3) is typical for tubular structures and corresponds to the characteristic radial breathing mode. The spectral features between 300 cm$^{-1}$ and 500 cm$^{-1}$ (labeled b in FIG. 3) are also likely attributable to tubular structures, since similar peaks have been reported for single walled carbon nanotubes. However, the absence of Raman peaks characteristic for the tangential vibration mode of ordered carbon visible in the 1580-1600 cm$^{-1}$ region peak indicated that the tubular structure is not carbon. The peaks observed at 525 cm$^{-1}$ and higher frequencies are believed to be due to α-boron clusters. The inset in FIG. 3 shows a boron nanotube with a clearly apparent single-walled tubular structure.

All boron nanotubes found in this sample appear in close proximity of the Mg-MCM-41 template support, suggesting that the growth of the nanotubes is initiated at the template support, most likely at the magnesium sites incorporated into the pore walls.

Instead of a Mg-MCM-41 framework, a B-MCM-41 framework, i.e., an MCM-41 framework having pores "loaded" with boron can also be used as a template. No boron nanotube growth has been observed on "pure" MCM-41 framework structures, although growth of nanofibers was detected. In addition to incorporating boron and magnesium in or on the pore walls of the MCM-41 framework pores, other metal atoms, such as Ni, Pd, Ce, Co, Mn, Mo and Al, and mixtures thereof, can also be incorporated. These metal atoms form combinations with boron, such as borides, that have a low enough decomposition temperature of, for example, less than approximately 950° C., and are small enough to be incorporated into the MCM-41 pore structure without disturbing the structural uniformity of the framework. Stated differently, to take advantage of the templating technique provided by the MCM-41 framework and to thereby control the structures formed, a strong interaction between the boron precursor and the nucleation sites on or in the pore walls is desired.

The pores of the B-MCM-41 and Mg-MCM-41 templates provide geometric constraints for the growth of nanowires and nanotubes with diameters small enough to promote one-dimensional physical properties. Reaction of BCl$_3$ with H$_2$ at temperatures ranging from 700° C.-900° C. over the MCM-41 template doped with either Mg or B can produce single walled boron nanotubes and other interesting boron nanostructures. Mg-MCM-41 was found to be most selective for single-walled nanotubes. One proposed growth mechanism is the decomposition of a boron complex formed in the geometrically confined pore environment leading to the formation of uniform nanostructures with the diameter controlled by the pores. Although representative data are presented only for a pore size of approximately 3.5 nm, experimental results obtained with Mg-MCM-41 frameworks with other pore sizes have shown that the diameter of the boron nanotubes produced is coincident with the template pore size. As mentioned above, the pore size can be controlled, for example, by a suitable selection of the surfactant or swelling agent used in the preparation of the MCM-41 template.

The reactant for the growth of the nanotubes and nanowires was diborane and/or BCl$_3$, with and without H$_2$ as a co-reactant. It was observed that a higher base pressure in the reactor produced a greater selectivity for longer boron nanotubes.

The Mg-MCM-41 framework used in the afore described experiments contained 1% Mg loading. Larger concentrations of Mg can be incorporated without changing the pore structure; varying the pH during template synthesis can change the surface characteristics of the pore wall. The uniform pore size distribution can be controlled within ±0.1 nm FWHM by maintaining the pH level at, for example, pH=11±0.1 throughout the entire synthesis process. The addition of the antifoaming agent improves the structural order of the framework.

Selectivity to the particular boron nanostructures is affected by the growth temperature, with nanotubes formed at the lowest temperatures between approximately 700° C. and 875° C., nanopipes formed at an intermediate temperature of approximately 900° C., and nanowires at higher temperatures. The selectivity may be caused by the tendency of boron to form clusters at higher temperatures.

"Pure" boron nanostructures may not be intrinsically stable because the boron bonds lack two electrons in order to satisfy Wade's rule; however, they appear nevertheless be close enough to Wade's rule to form stable structures. One approach for stabilizing the boron nanostructures, i.e., nanotubes and nanowires, is to incorporate into the nanostructures during the growth of the nanostructures an electron donor, such as elements from the Group Ia or Group IIa of the periodic table of elements. Suitable donor atoms are, for example, Lithium, Beryllium, and Magnesium. Alternatively or in addition, the as-grown nanotubes and nanowires can also be exposed to an ambient that contains these elements and/or mixtures thereof. Both the boron precursors (boron halides, diborane) as well as the compounds containing the donor elements can also be activated, for example, by photo dissociation.

Metallic nanotubes, such as the afore described boron nanotubes, provide the unusual opportunity to achieve confinement at much smaller dimensions beyond the reach of lithography. The confinement effects in metallic nanotubes can be tuned through changes in the diameter, chirality, doping and temperature. Dramatic alteration of both the phonon and electron structure of one-dimensional nanotubes offers the possibility of novel superconducting behavior that cannot be accessed in higher dimensions.

In carbon compounds, π band electrons lie at the top of the Fermi sea and are known to couple only weakly to the powerful zone-centered phonons, such as the C60 breathing mode. Conversely, in superconducting MgB$_2$, holes in the α-band are the primary charge carriers, which couple very strongly (and preferentially) to the optical planar bond-stretching modes of the boron layers. Since Al-B$_2$ type compounds are essentially isoelectronic forms of graphite, with the graphite-like boron planes being stabilized by charge injected from the action, this mechanism of superconductivity may indicate interesting possibilities for other graphite-related compounds. For example, superconductivity has been reported below 4 K in boron-doped diamond, and in Li-doped bulk α-boron at 35 K. The possibility to attach or incorporate various captions in boron nanotubes could offer novel possibilities for useful superconducting materials.

As mentioned above, electron donor atoms, such as Li, Be and Mg, added to the boron nanostructures are expected to affect their electronic and superconducting properties. Pure boron nanotubes can be converted into MgB$_2$ nanotubes by heating in Mg vapor at temperatures between 850° C. and 1000° C. This conversion can be done either with the nanotubes removed from the B-MCM-41 or Mg-MCM-41 template, or with the nanotubes still attached to the template. In the latter case, the template with nanotubes is heated to between 900-1000° C. The same process also converts nanowires and nanopipes to $MgB_2$ structures.

Boron nanostructures can also be doped with Li using lithium borohydride or organo-lithium reagents, such as t-butyl lithium. Since lithium borohydride is more volatile than Mg vapor, the reactor is a closed reactor rather than a flow reactor, with the nanotubes being mixed with lithium borohydride and heated to between 400° C. and 1000° C. while still in the template, i.e., after synthesis but before template removal.

Beryllium can be incorporated by similar methods, starting, for example, with an organo-beryllium compound, and produces similar physical properties. It will be understood, however, that the particular method for incorporating the dopant atoms depends on the dopant and the selected precursor. Ideally, the precursors should only contain the metal to be incorporated and H and/or boron. Donor metal halides have also been shown to have little detrimental effect on the produced nanostructures.

Preliminary data based on magnetic susceptibility measurements have shown that the superconducting transition temperature $T_c(H=0)$ of Mg-doped boron nanotubes is noticeably higher (on the order of 100 K) than the transition temperature of around 36 K observed for polycrystalline $MgB_2$ and thicker $MgB_2$ wires (around 100 μm diameter).

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A one-dimensional superconducting device comprising a boron nanostructure having a diameter of less than 50 nm and impregnated with an electron donor element, the boron nanostructure having a superconducting transition temperature greater than 36 degrees K, wherein the boron nanostructure comprises a nanotube.

2. The device of claim 1, wherein the nanotube has a diameter of less than 10 nm.

3. The device of claim 1, wherein the nanotube is a single-wall nanotube.

4. A one-dimensional superconducting device comprising a boron nanostructure having a diameter of less than 50 nm and impregnated with an electron donor element, the boron nanostructure having a superconducting transition temperature greater than 36 degrees K, wherein the boron nanostructure comprises a nanofiber having a diameter of less than 1 nm.

5. The device of claim 4, wherein the boron nanostructure comprises a plurality of nanofibers that are aligned in a parallel fashion or intertwined.

6. The device of claim 4, wherein the nanofiber comprises boron atoms arranged in a polyethylene-like chain structure.

7. A single-wall boron nanotube impregnated with an electron donor element, the nanotube having a diameter less than 100 nm and a superconducting transition temperature greater than 36 degrees K.

8. The nanotube of claim 7, wherein the electron donor element is selected from an element of Group Ia or Group IIa of the periodic table of elements.

9. The nanotube of claim 7, wherein the electron donor element is selected from the group consisting of Lithium, Beryllium and Magnesium.

10. The device of claim 7, wherein the electron donor element comprises magnesium and is incorporated in the boron nanotube with a concentration so as to convert the boron nanostructure into magnesium diboride ($MgB_2$).

* * * * *